(12) United States Patent
Balakrishnan et al.

(10) Patent No.: US 9,653,362 B2
(45) Date of Patent: May 16, 2017

(54) COMPLEMENTARY HETEROGENEOUS MOSFET USING GLOBAL SIGE SUBSTRATE AND HARD-MASK MEMORIZED GERMANIUM DILUTION FOR NFET

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/225,157

(22) Filed: Aug. 1, 2016

(65) Prior Publication Data

US 2017/0040223 A1 Feb. 9, 2017

Related U.S. Application Data

(63) Continuation of application No. 14/817,549, filed on Aug. 4, 2015, now Pat. No. 9,484,266.

(51) Int. Cl.
*H01L 21/8238* (2006.01)
*H01L 27/12* (2006.01)
*H01L 27/092* (2006.01)
*H01L 29/10* (2006.01)
*H01L 29/16* (2006.01)
*H01L 29/161* (2006.01)

(Continued)

(52) U.S. Cl.
CPC ........ *H01L 21/823807* (2013.01); *H01L 21/02532* (2013.01); *H01L 21/823821* (2013.01); *H01L 21/845* (2013.01); *H01L 27/0924* (2013.01); *H01L 27/1211* (2013.01); *H01L 29/1054* (2013.01); *H01L 29/16* (2013.01); *H01L 29/161* (2013.01)

(58) Field of Classification Search
CPC ......... H01L 21/8238; H01L 21/823807; H01L 21/8232; H01L 21/823821; H01L 21/823431
See application file for complete search history.

(56) References Cited

U.S. PATENT DOCUMENTS 7,037,770 B2  5/2006  Chidambarrao et al.
7,615,435 B2  11/2009 Gluschenkov et al.
(Continued)

*Primary Examiner* — Phuc Dang
(74) *Attorney, Agent, or Firm* — Harrington & Smith; Louis J. Percello

(57) ABSTRACT

A method includes providing a substrate that underlies a layer of SiGe; forming a plurality of fins in the layer of SiGe. Each formed fin has a fin shape and fin location preserving hard mask layer on a top surface. The method also includes depositing Si on a first subset of the set of fins in what will be an nFET area; performing a Si—Ge inter-mixing process on the first subset of fins to reduce a concentration of Ge in the first subset while producing a Si—Ge intermix layer; removing the Si—Ge intermix layer leaving the first subset of fins having the reduced concentration of Ge, and forming a second subset of fins in what will be a pFET area. The second subset is also formed from the layer of SiGe and has a greater percentage of Ge than a percentage of Ge in the first subset of fins.

10 Claims, 11 Drawing Sheets

(51) Int. Cl.
 *H01L 21/84* (2006.01)
 *H01L 21/02* (2006.01)

(56) References Cited

U.S. PATENT DOCUMENTS

| | | |
|---|---|---|
| 8,232,186 B2 | 7/2012 | Harley et al. |
| 8,298,882 B2 | 10/2012 | Cheng et al. |
| 8,673,718 B2 * | 3/2014 | Maszara ........... H01L 29/66795 438/268 |
| 2012/0068267 A1 | 3/2012 | Bedell et al. |
| 2012/0216158 A1 | 8/2012 | Bedell et al. |
| 2012/0228716 A1 | 9/2012 | Harley et al. |
| 2013/0037869 A1 * | 2/2013 | Okano .............. H01L 29/66795 257/288 |
| 2014/0284719 A1 * | 9/2014 | Khakifirooz .......... H01L 21/845 257/351 |

\* cited by examiner

COMPLEMENTARY HETEROGENEOUS MOSFET USING GLOBAL SIGE SUBSTRATE AND HARD-MASK MEMORIZED GERMANIUM DILUTION FOR NFET

CROSS-REFERENCE TO A RELATED US PATENT APPLICATION

This patent application is a continuation application of copending U.S. patent application Ser. No. 14/817,549, filed on Aug. 4, 2015, and is further related to copending U.S. patent application Ser. No. 15/133,525, filed on Apr. 20, 2016, the disclosures of which are incorporated by reference herein in their entireties.

TECHNICAL FIELD

The various embodiments of this invention relate generally to semiconductor devices and fabrication techniques and, more specifically, relate to the fabrication of semiconductor transistor devices composed of Si and SiGe on a common substrate.

BACKGROUND

Tensile strained silicon (s-Si) enhances electron mobility by lifting the conduction band degeneracies, reducing carrier scattering and increasing the population of carriers in sub-bands with lower transverse effective mass. Channel engineering using Si or s-Si for an nFET and compressive strained SiGe for a pFET is a viable option for realizing small geometry devices while meeting performance targets. Multiple epitaxial deposition approaches might potentially be used for fabricating nFETs and pFETs, however the design rules and epitaxial non-idealities such as corner rounding, thickness and surface control limit the heterogeneous integration of Si and SiGe.

SUMMARY

In a first aspect thereof the embodiments of this invention provide a method that comprises providing a substrate that underlies a layer of SiGe; forming a plurality of fins in the layer of SiGe, each formed fin comprising a hard mask layer on a top surface; depositing Si on a first subset of the set of fins in what will be an nFET area; performing a Si—Ge inter-mixing process on the first subset of fins to reduce a concentration of Ge in the first subset of fins while producing a Si—Ge intermix layer; removing the Si—Ge intermix layer leaving the first subset of fins having the reduced concentration of Ge and forming a second subset of fins in what will be a pFET area, the second subset of fins being formed from the layer of SiGe and having a greater percentage of Ge than a percentage of Ge in the first subset of fins.

In another aspect thereof the embodiments of this invention provide a structure that comprises a substrate and a first subset of fins defined in an nFET area of the structure. The first subset of fins is comprised of tensile strained substantially pure Si formed from an initial semiconductor layer disposed over the substrate, where the initial semiconductor layer is comprised of a layer of $Si_{1-x}Ge_x$ having a first value of x. The structure further comprises a second subset of fins defined in a pFET area of the structure. The second subset of fins is comprised of compressive strained $Si_{1-x}Ge_x$ formed from the initial semiconductor layer and has a second value of x that is greater than the first value of x. In the structure each fin of at least the first subset of fins is comprised of an overlying hard mask layer that preserves a location and shape of the first subset of fins during a process to reduce the value of x in the initial semiconductor layer.

BRIEF DESCRIPTION OF THE SEVERAL VIEWS OF THE DRAWINGS

FIGS. 1-6 pertain to the first embodiment of this invention, wherein FIG. 1 illustrates a starting structure comprised of a bulk Si substrate, an overlying oxide layer (buried oxide layer or BOX), a strained SiGe layer formed on the BOX and a plurality of hard masks (HMs) disposed on the SiGe layer;

FIG. 2 shows the structure of FIG. 1 after formation of a plurality of fins in the SiGe layer, each fin underlying one of the HMs;

FIG. 3 shows the structure of FIG. 2 after formation of a mask over a first sub-set of the fins (fins that will be pFET fins) and the growth of a layer of Si on exposed sidewall surfaces of the s-SiGe fins;

FIG. 4 shows the structure of FIG. 3 after performing a Ge—Si intermix process to dilute the Ge in the s-SiGe fins and form diluted SiGe;

FIG. 5 shows the structure of FIG. 4 after removing the diluted SiGe;

FIG. 6 shows the structure of FIG. 5 after removing the masks leaving the s-SiGe fins in a pFET area and Ge-depleted (e.g., almost pure Si) diluted fins in an nFET area.

FIGS. 7-17 pertain to the second embodiment of this invention, wherein FIG. 7 illustrates a starting structure comprised of a bulk Si substrate, an overlying oxide layer (buried oxide layer or BOX), a strain-relaxed SiGe layer formed on the BOX and a plurality of hard masks (HMs) disposed on the SiGe layer;

FIG. 8 shows the structure of FIG. 7 after formation of a mask 40 (e.g., an oxide) where a first sub-set of fins will be formed, i.e., those fins that will be pFET fins in the final structure;

FIG. 9 shows the structure of FIG. 8 after selectively removing the strain-relaxed SiGe to define a second sub-set of fins forming strain-relaxed SiGe fins 38 that will be nFET fins in the final structure;

FIGS. 10, 11 and 12 correspond to the process of FIGS. 3, 4 and 5, respectively, wherein FIG. 10 illustrates the growth a layer of Si on exposed sidewall surfaces of the strain-relaxed SiGe fins;

FIG. 11 shows the structure of FIG. 10 after performing the high-temperature Ge—Si intermix process and forming diluted SiGe;

FIG. 12 shows the structure of FIG. 11 after removing the diluted SiGe leaving diluted SiGe fins;

FIG. 13 shows the structure of FIG. 12 after removing the pFET mask and forming an nFET mask;

FIG. 14 shows the structure of FIG. 13 after forming a nitride spacer around each of the HMs in the pFET area to widen the HMs;

FIG. 15 shows the structure of FIG. 14 after removing those portions of the strain-relaxed SiGe layer not covered by the widened HMs leaving strain-relaxed $Si_{1-x}Ge_x$ fin precursor structures;

FIG. 16 shows the structure of FIG. 15 after performing a condensation process for the strain-relaxed $Si_{1-x}Ge_x$ fin precursors to increase the Ge percentage, reduce the width and form a layer of thermal oxide; and FIG. 17 shows the structure of FIG. 16 after removing the nFET mask, the HMs and nitride spacers and the thermal oxide, thereby leaving the higher Ge percentage SiGe fins in a pFET area and the Ge-depleted (e.g., almost pure Si) diluted fins in an nFET area.

DETAILED DESCRIPTION

Figure 1:
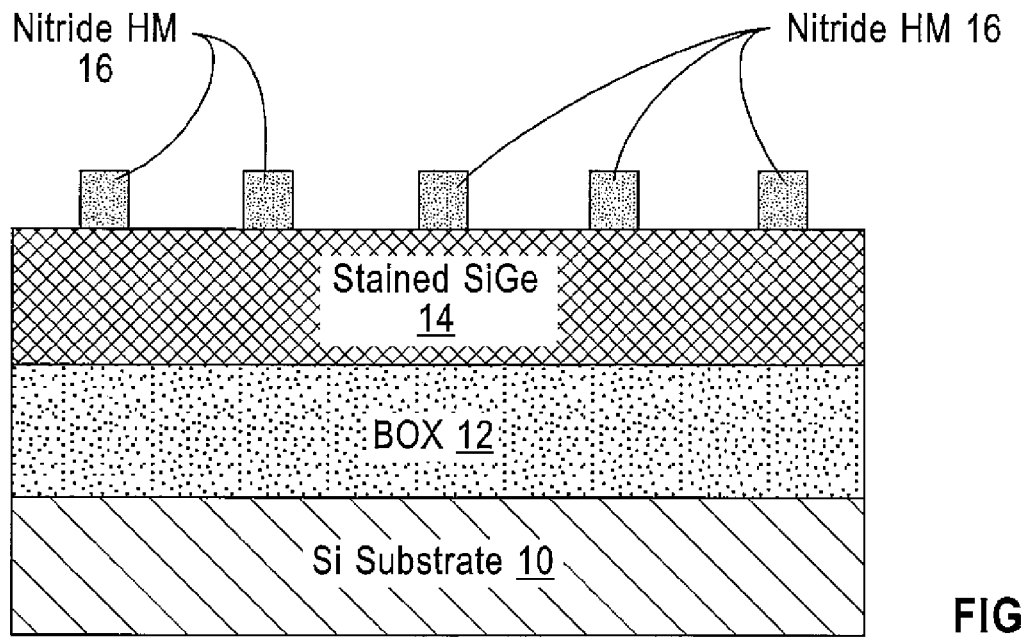
FIGS. 1-17 are each an enlarged cross-sectional view showing various initial, intermediate and completed or substantially completed structures that are fabricated in accordance with a first and a second embodiment of this invention, wherein the various layer thicknesses and other dimensions are not necessarily drawn to scale. More specifically.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses and methods that are suitable for use in implementing the embodiments of this invention can include, but are not limited to, chemical vapor deposition (CVD) such as, for example, rapid thermal chemical vapor deposition (RTCVD), atmospheric pressure chemical vapor deposition (APCVD), low pressure chemical vapor deposition (LP-CVD) and ultra-high vacuum chemical vapor deposition (UHVCVD). Other suitable epitaxial growth processes can include, but are not limited to, molecular beam epitaxy (MBE) and low-energy plasma deposition (LEPD). The temperature for an epitaxial deposition process typically ranges from about 550° C. to about 900° C. Although higher temperature will typically result in faster deposition of the semiconductor material, the faster deposition may also result in crystal defects and film cracking.

In at least one embodiment thereof this invention can employ semiconductor on insulator (SOI) technology where a thin semiconductor layer, such as a layer of SiGe or a layer of Si, is formed over an insulating dielectric layer, such as a layer of silicon oxide, which in turn is formed over a (bulk) substrate, such as a Si substrate. The insulating layer can be referred to as a buried oxide (BOX) layer or simply as a BOX. For a single BOX SOI wafer the SOI layer can be divided into active regions by shallow trench isolation (STI) which intersects the BOX and provides total isolation for active device regions formed in the SOI layer. For FinFET devices fin structures can be defined in the SOI layer and sources and drains can be formed, for example, by ion implantation of N-type or P-type dopants into the fins. A FET channel region between a source/drain pair can be created so as to underlie a gate structure.

The embodiments of this invention pertain at least in part to the heterogeneous integration of SiGe (compressive) and Si (relaxed or tensile) on a common wafer, such as a SOI wafer. The use of the embodiments of this invention provides a number of advantages and benefits. These include, but are not limited to, the following examples. The process begins with globally relaxed or strained SiGe film on insulator (SOI) and thus no epitaxial adjustment is needed before fin patterning. The initial thickness of the film controls the final fin height for both nFETs and pFETs. In addition, the nFET Ge content is diluted by epitaxy of Si on fin sidewalls and by an intermix process that is performed to dilute the Ge, followed by RIE to remove the intermixed SiGe. A nitride hard mask (HM) that is used on top of the fins has a memory effect for both fin location and fin width, thereby preserving the dimensions of the nFETs during processing. In addition, the process of Si epitaxy, Ge dilution and RIE can be repeated multiple times in order to achieve almost pure Si fins for the nFETs, while the HM memory effect results in a fixed fin width. In a further embodiment, where relaxed SiGe can be used as starting material, there is provided a combination of the HM memorized dilution and a Ge condensation process to achieve tensile s-Si for nFETs and compressive s-SiGe for pFETs.

FIGS. 1-6 pertain to a first embodiment of this invention. FIG. 1 shows a starting structure (starting wafer) that can be comprised of a Si substrate 10 of arbitrary thickness, an overlying BOX 12 and a layer 14 of $s-Si_{1-x}Ge_x$ (e.g., where x~0.20). The layer 14 of $s-Si_{1-x}Ge_x$ could have a thickness of about 35 nm±15 nm. The layer 14 of s-SiGe can be formed using, for example, Ge intermix or Ge thermal condensation processes. It is preferred that the layer 14 of $s-Si_{1-x}Ge_x$ be approximately or substantially lattice-matched to the Si substrate 10. Also shown in FIG. 1 is the result of patterning a nitride hard mask (HM) layer to form a plurality of HMs 16. Each is located at a position where a fin is desired to be formed in the layer 14 of $s-Si_{1-x}Ge_x$.

Figure 2:
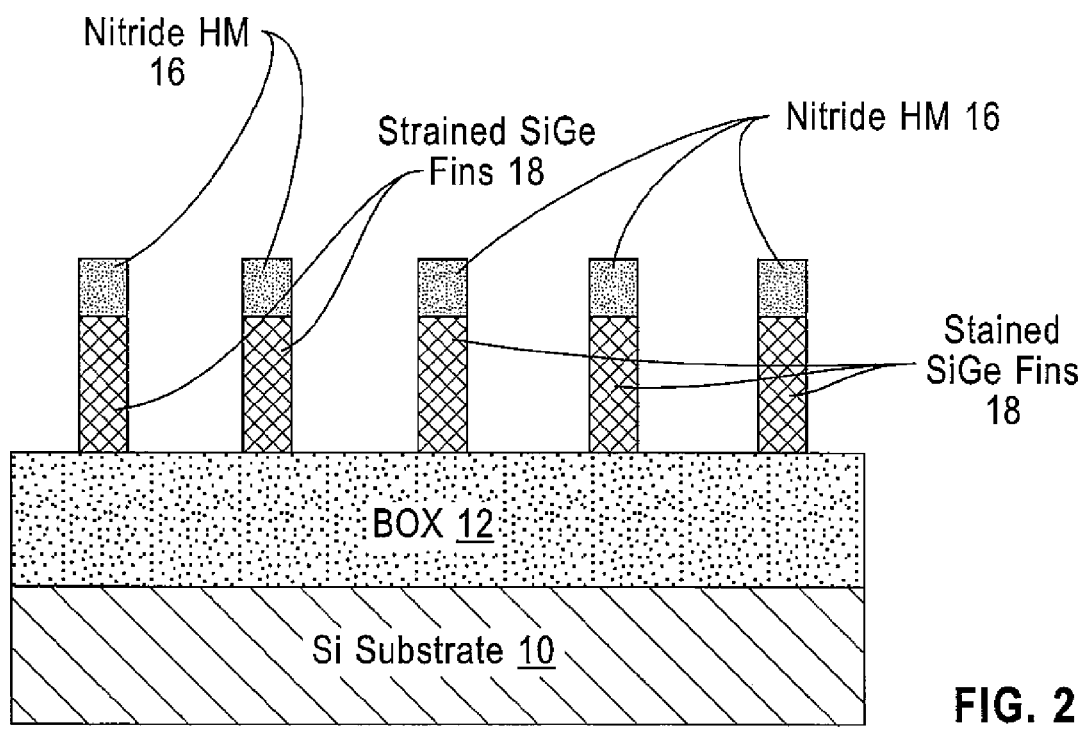

FIG. 2 shows the structure of FIG. 1 after formation of a plurality of fins 18 in the SiGe layer 14, where each fin 18 underlies one of the HMs 16. The fins 18 can be formed by a reactive ion etch (RIE) process using any suitable chemistry that is selective to the material of the BOX 12. Examples include chlorine-based and bromine-based etch chemistries. Each fin 18 has a height, relative to the top surface of the BOX 12, that is the same as the thickness of the layer 14 of $s-Si_{1-x}Ge_x$, e.g., about 35 nm±15 nm and can have a width governed by the width of the overlying HM 16, e.g., about 7 nm to about 14 nm (or greater). The fin length can have any desired value depending on the end use.

Figure 3:
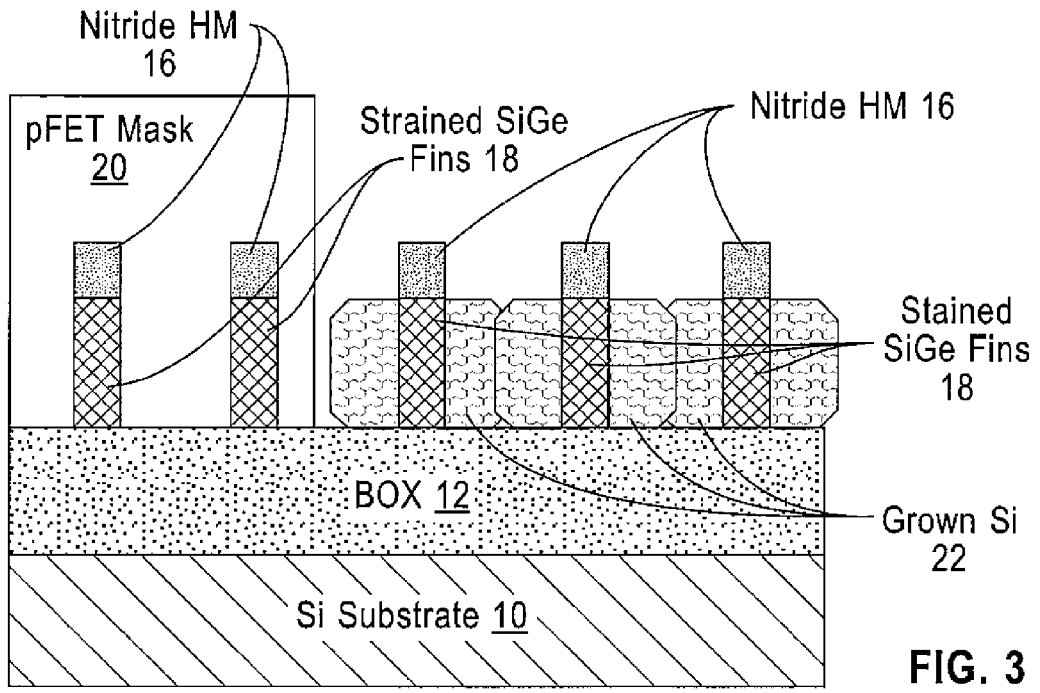

FIG. 3 shows the structure of FIG. 2 after formation of a mask 20 (e.g., an oxide) over a first sub-set of the fins 18, i.e., those s-SiGe fins 18 that will be pFET fins in the final structure, thereby leaving exposed a second sub-set of the fins 18 that will be nFET fins in the final structure. Next the method selectively grows a layer 22 of Si on exposed sidewall surfaces of the s-SiGe fins 18. A CVD process (e.g., rapid thermal CVD) can be used for this purpose. The Si layer 22 can be formed by the epitaxial growth of Si on the exposed surfaces of the SiGe fins 18 using a mixture of silane and dichlorosilane. The HMs 16 provide a "memory" effect that records the locations (and widths) of the original fins 18.

Figure 4:
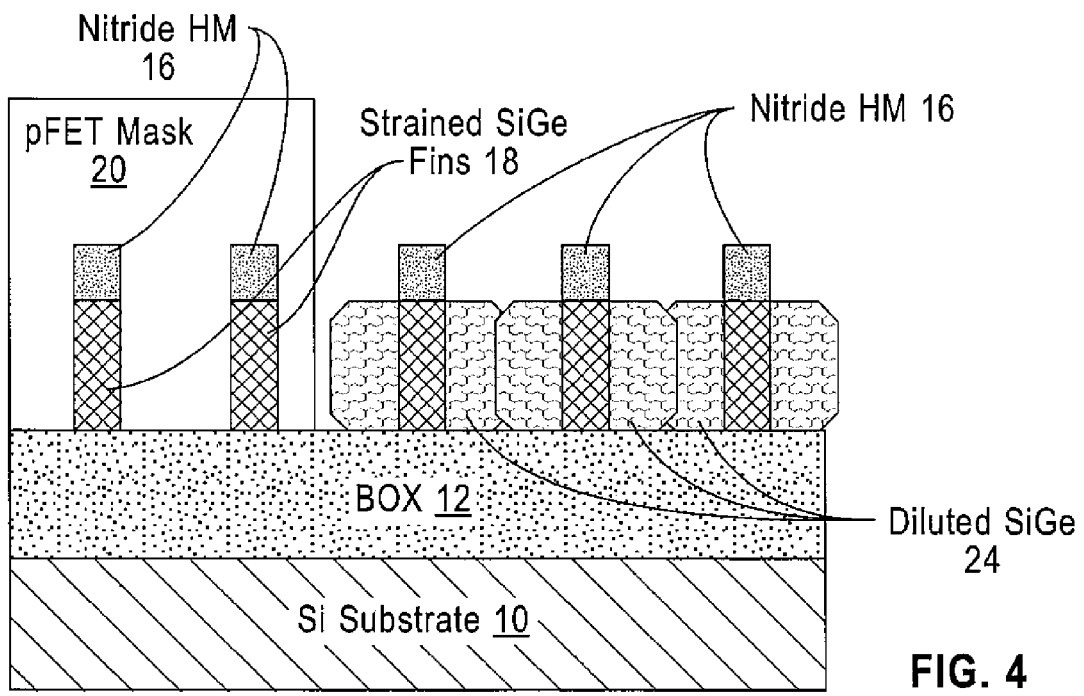
Figure 5:
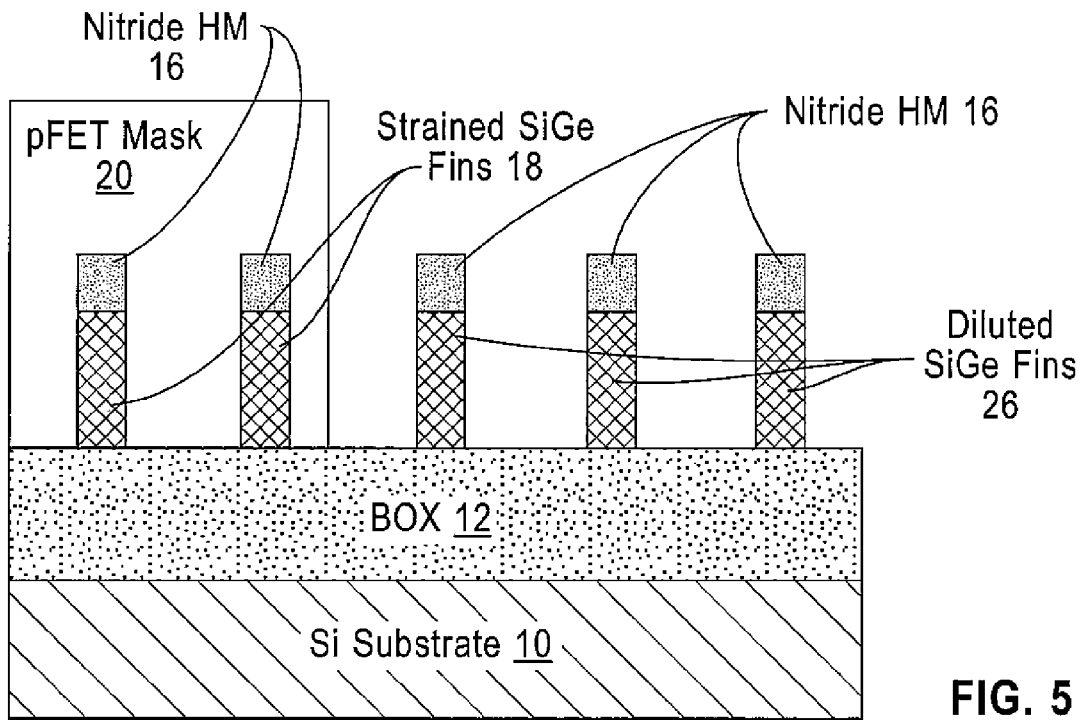

FIG. 4 shows the structure of FIG. 3 after performing a high-temperature (e.g., 1000° C.) Ge—Si intermix process where Ge in the fins 18 diffuses into the Si layer 22 and where Si in the layer 22 diffuses into the SiGe fins 18. Due to the dominance of the Si in the grown Si layers 22 during this inter-diffusion process the Ge of the SiGe fins 18 is diluted. As an example, and considering an exemplary 7 nm SiGe fin width, a 32 nm fin pitch (the space between fins 18 now occupied by the grown Si 22) and an initial Ge percentage of 20% in the SiGe fins 18, the Ge percentage can be diluted to about 4.3% during the Ge—Si intermix process. This process produces what may be referred to as a Si—Ge intermix layer that is comprised of diluted SiGe 24. FIG. 5 shows the structure of FIG. 4 after removing the diluted SiGe 24 by any suitable RIE or other type of etch procedure, thereby leaving diluted SiGe fins 26 each still covered by their respective HMs 16. There are certain RIE processes that can etch SiGe selective to the nitride HM 16. As but one non-limiting example, HBr/He/O$_2$/He can be used for this purpose.

In accordance with a non-limiting aspect of this invention the steps of FIGS. 3, 4 and 5 can be iterated any desired number of times to grow the Si 22 (FIG. 3), perform the Ge—Si intermix process (FIG. 4) and then remove the resulting diluted SiGe 24 (FIG. 5). After each such iteration the Ge content of the diluted SiGe fins 26 is reduced further. In other words, the steps of FIGS. 3, 4 and 5 can be repeated as needed to asymptotically approach a desired, e.g., a substantially zero, Ge percentage in the fins 26. This iterative process can result in producing substantially pure (tensile strained) Si fins for the nFETs to be fabricated.

By "substantially pure" Si fins what is meant is that the percentage of Ge is reduced to, for example, less than about 5%, or more preferably less than about 3%, or even more preferably less than about 1% so as to result in a tensile-strained Si-containing fin that can function as an nFET in a final circuit.

Figure 6:
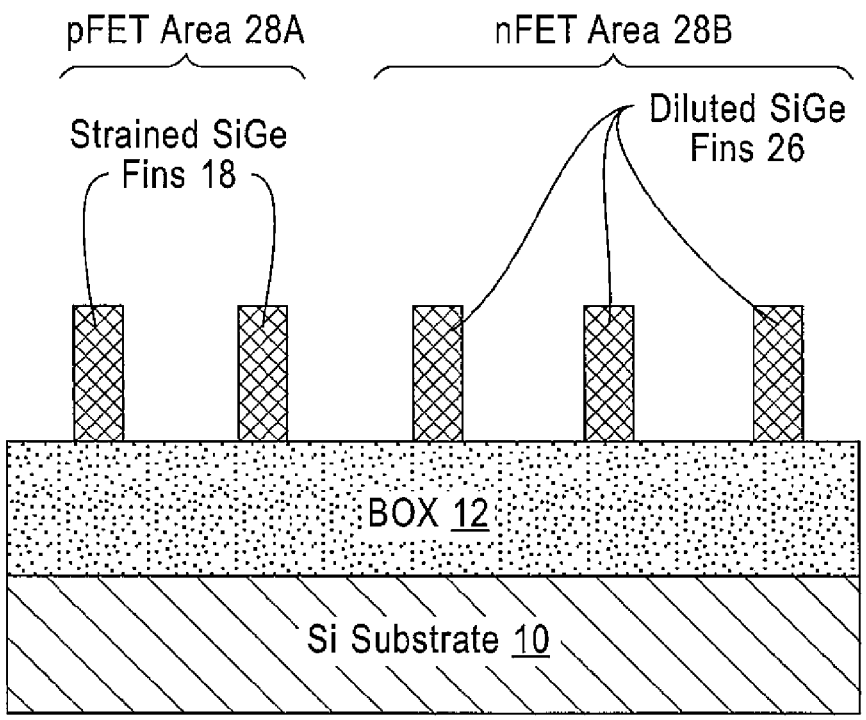

FIG. 6 shows the structure of FIG. 5 after removing the pFET mask 20 and the HMs 16 leaving the s-SiGe fins 18 in a pFET area 28A and the Ge-depleted (e.g., substantially pure Si) diluted fins 26 in an nFET area 28B. In this embodiment the s-SiGe fins 18 and the diluted SiGe fins 28 can have substantially equal fin widths that are established (and maintained during nFET processing) by the width of the HM 16. Processing can then continue in a conventional manner to form source/drains (S/Ds), gate structures, dielectric layer deposition(s) and vertical and horizontal metallization as needed for the final circuitry.

Figure 7:
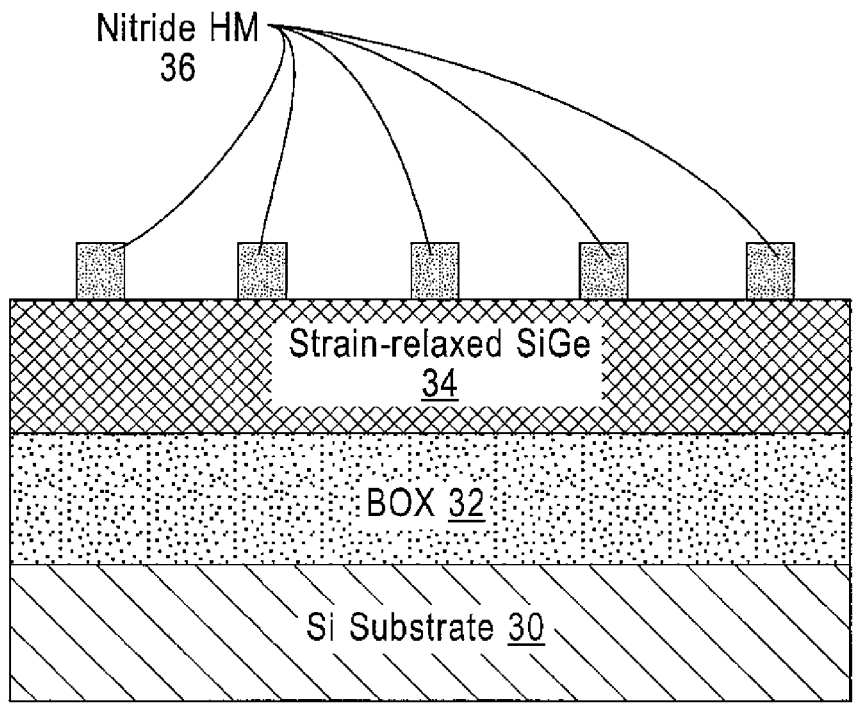

FIGS. 7-17 pertain to a second embodiment of this invention. FIG. 7 shows a starting structure (starting wafer) that can be comprised of a Si substrate 30 of arbitrary thickness, an overlying BOX 32 and a layer 34 of strain-relaxed $Si_{1-x}Ge_x$ (e.g., where x~0.25). The top layer 34 of strain-relaxed $Si_{1-x}Ge_x$ could have a thickness of about 35 nm+15 nm. The layer 34 can be provided, for example, by a wafer bonding process, where after wafer bonding a handle wafer is removed and the layer 34 is thinned to the desired thickness. A high temperature anneal (e.g., 1200° C. to 1300° C.) could also be used to relax a s-SiGe layer that is formed using, for example, Ge intermix or Ge thermal condensation processes. As in the embodiment of FIGS. 1-6 it is preferred that the layer 34 of strain-relaxed $Si_{1-x}Ge_x$ be approximately lattice-matched to the Si substrate 30. Also shown in FIG. 7 is the result of patterning a nitride hard mask (HM) layer to form a plurality of HMs 36. Each HM 36 is located at a position on the surface of the strain-relaxed $Si_{1-x}Ge_x$ layer 34 where a fin is desired to be formed.

Figure 8:
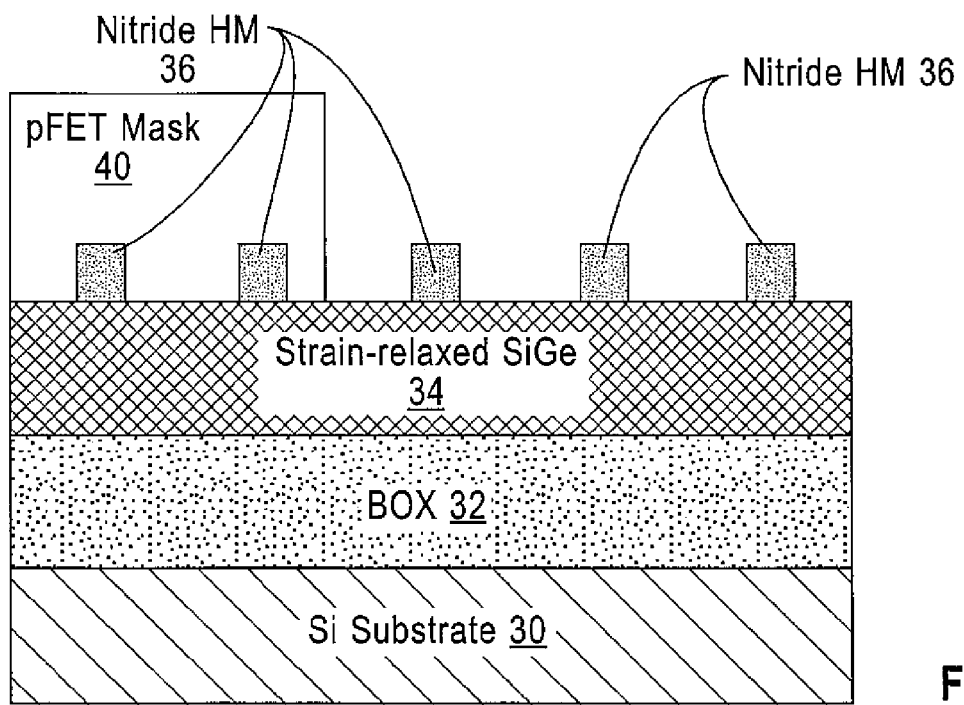

FIG. 8 shows the structure of FIG. 7 after formation of a mask 40 (e.g., an oxide) where a first sub-set of fins will be formed, i.e., those fins that will be pFET fins in the final structure.

Figure 9:
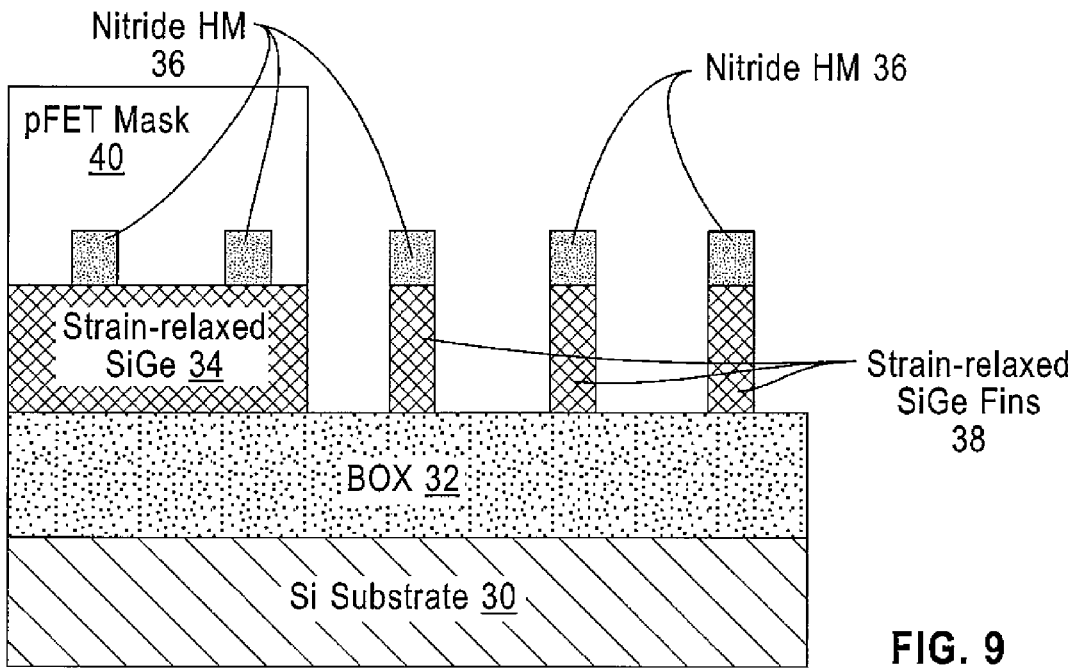

FIG. 9 shows the structure of FIG. 8 after performing an RIE procedure to selectively remove the strain-relaxed SiGe 34 to define a second sub-set of fins forming strain-relaxed SiGe fins 38 that will be nFET fins in the final structure. Each of the fins 38 has a width and a length defined by the overlying HM 36 and is disposed on the surface of the BOX 32. A height of each of the strain-relaxed SiGe fins 38 corresponds to the thickness of the strain-relaxed SiGe layer 34 or, in this non-limiting embodiment, about 35 nm±15 nm.

Figure 10:
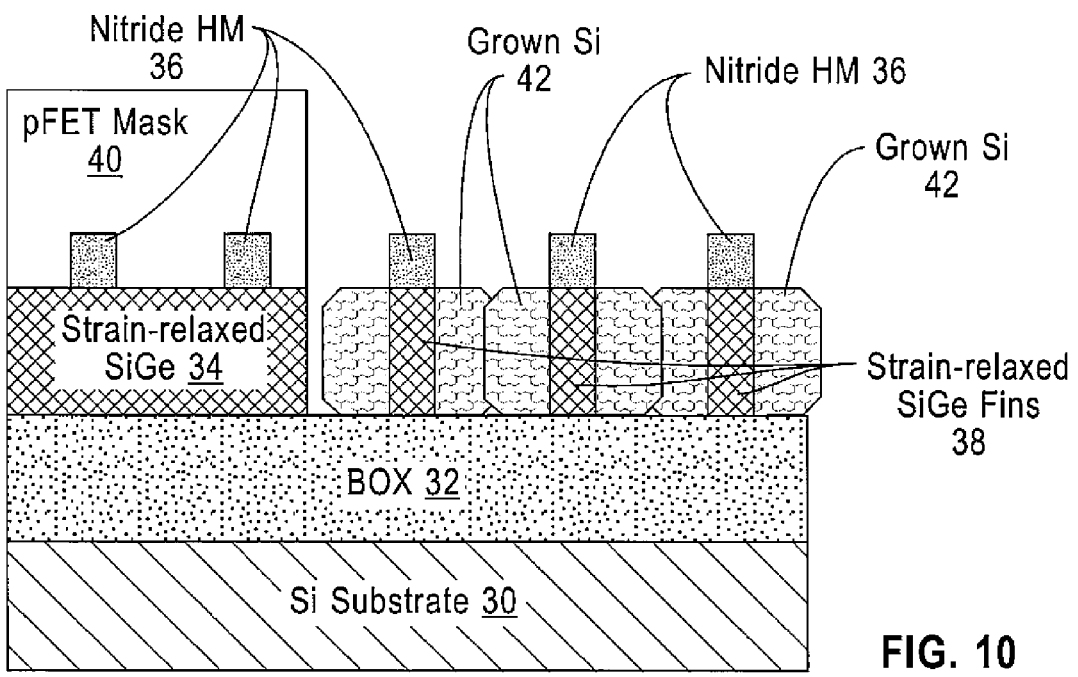
Figure 11:
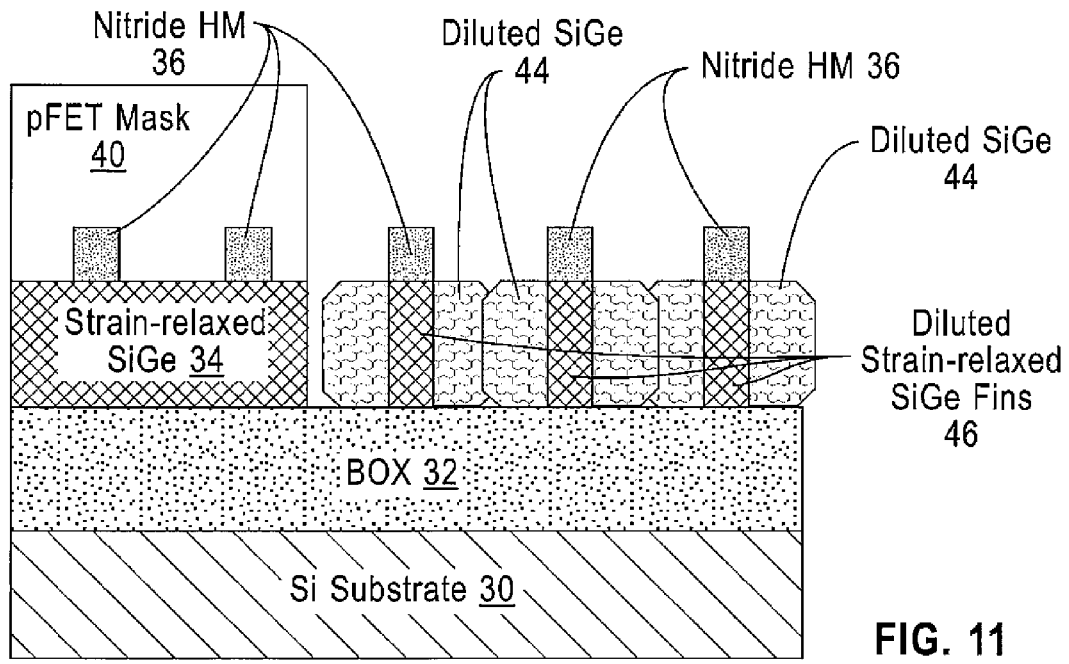
Figure 12:
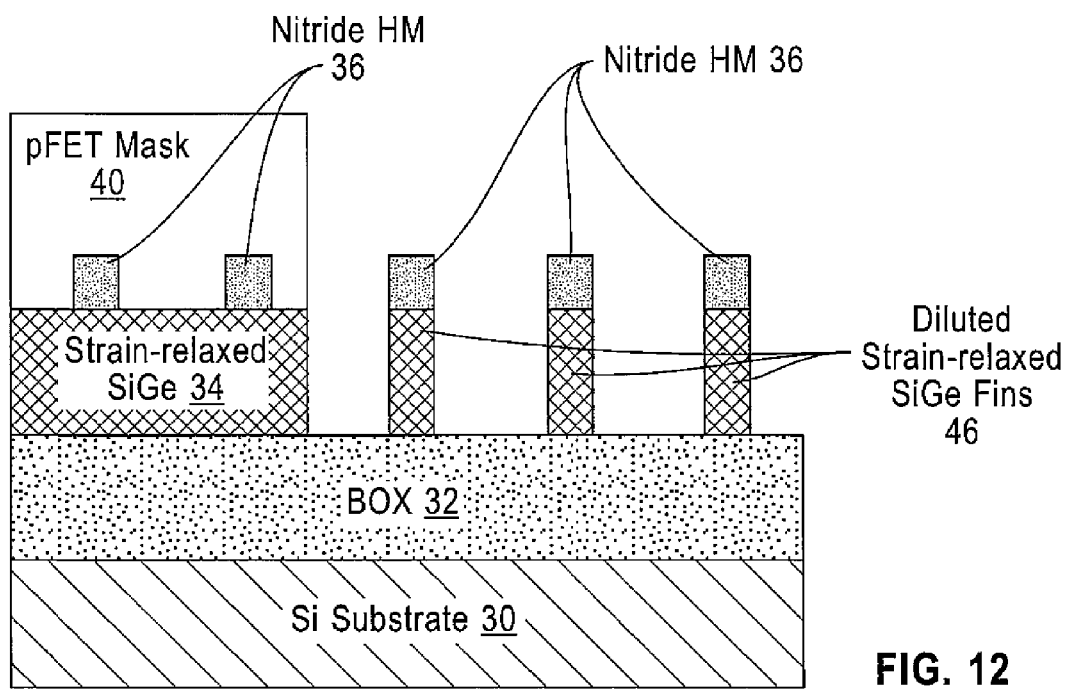

FIGS. 10, 11 and 12 correspond to the process described above for FIGS. 3, 4 and 5, respectively. More specifically, FIG. 10 illustrates the growth a layer 42 of Si on exposed sidewall surfaces of the strain-relaxed SiGe fins 38. As in FIG. 3, a CVD process (e.g., rapid thermal CVD) can be used for this purpose. The Si layer 42 can be formed by the epitaxial growth of Si on the exposed surfaces of the strain-relaxed SiGe fins 38 using a mixture of silane and dichlorosilane, and the HMs 36 provide a "memory" effect that records the locations (and widths) of the original fins 38. FIG. 11 shows the structure of FIG. 10 after performing the high-temperature (e.g., 1000° C.) Ge—Si intermix process where Ge in the fins 38 diffuses into the Si layer 42 and where Si in the layer 42 diffuses into the SiGe fins 38. Due to the dominance of the Si in the grown Si layers 42, during this inter-diffusion process the Ge of the strain-relaxed SiGe fins 38 is diluted. As an example, and considering again an exemplary 7 nm width of the strain-relaxed SiGe fins 38, a 32 nm fin pitch and an initial Ge percentage of 25% in the strain-relaxed SiGe fins 38, the Ge percentage can be diluted to a range of about 5%-6% during the Ge—Si intermix process. FIG. 12 shows the structure of FIG. 11 after removing the diluted SiGe 44 by any suitable RIE or other type of etch procedure, thereby leaving diluted SiGe fins 46 each still covered by their respective HMs 16.

As with the embodiment of FIGS. 3, 4 and 5, and further in accordance with a non-limiting aspect of this invention, the steps of FIGS. 10, 11 and 12 can be iterated any desired number of times to grow the Si 42 (FIG. 10), perform the Ge—Si intermix process (FIG. 5) and then remove the resulting diluted SiGe 44 (FIG. 12). After each such iteration the Ge content of the diluted SiGe fins 26 is reduced further. Thus, the steps of FIGS. 10, 11 and 12 can be repeated as needed to asymptotically approach a desired, e.g., a substantially zero, Ge percentage in the diluted strain-relaxed fins 46. The use of this iterative process can result in producing substantially pure (tensile strained) Si fins for the nFETs to be fabricated.

Figure 13:
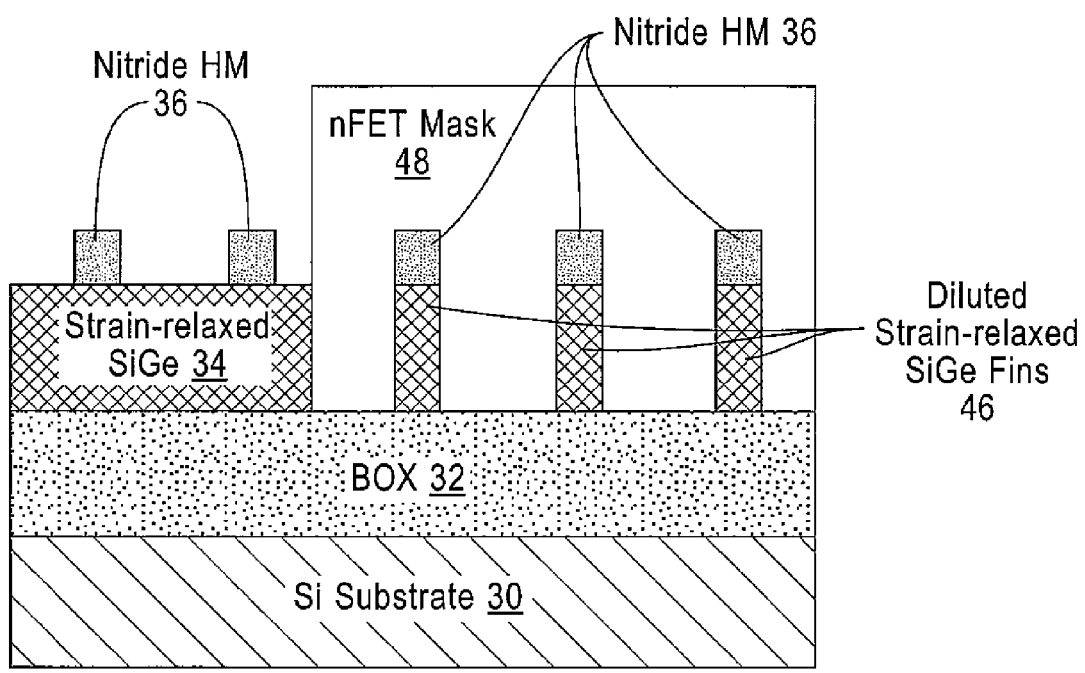

FIG. 13 shows the structure of FIG. 12 after removing the pFET mask 40 and forming an nFET mask 48 to cover the diluted strain-relaxed fins 46 and their corresponding HMs 36.

Figure 14:
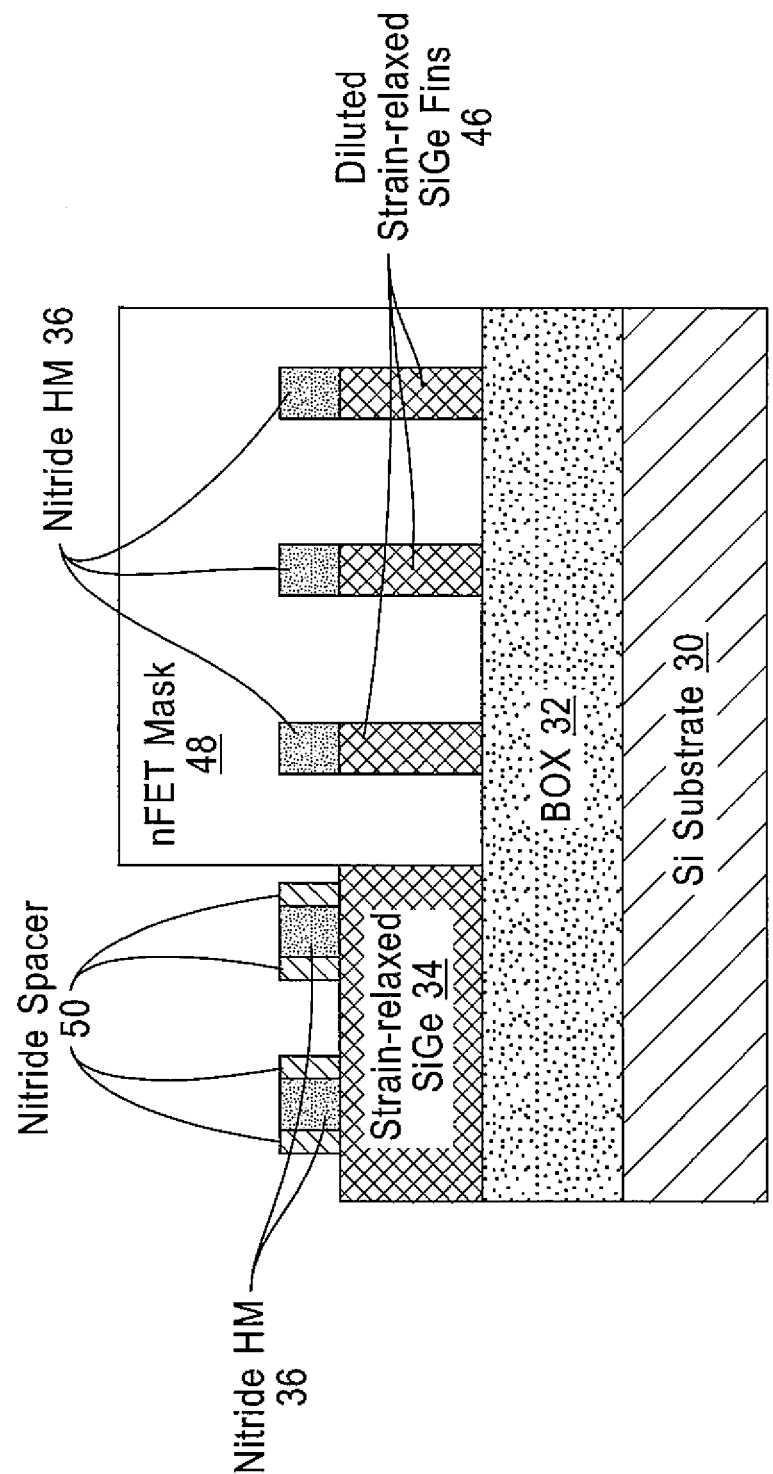

FIG. 14 shows the structure of FIG. 13 after forming a nitride spacer 50 around each of the HMs 36 in the pFET area. The nitride spacers 50 serve to widen the HMs 36. The width of the nitride spacer can be in a range of about 4 nm to about 12 nm, whereas the width of the original HM 36 can be in a range of about 5 nm to about 20 nm.

Figure 15:
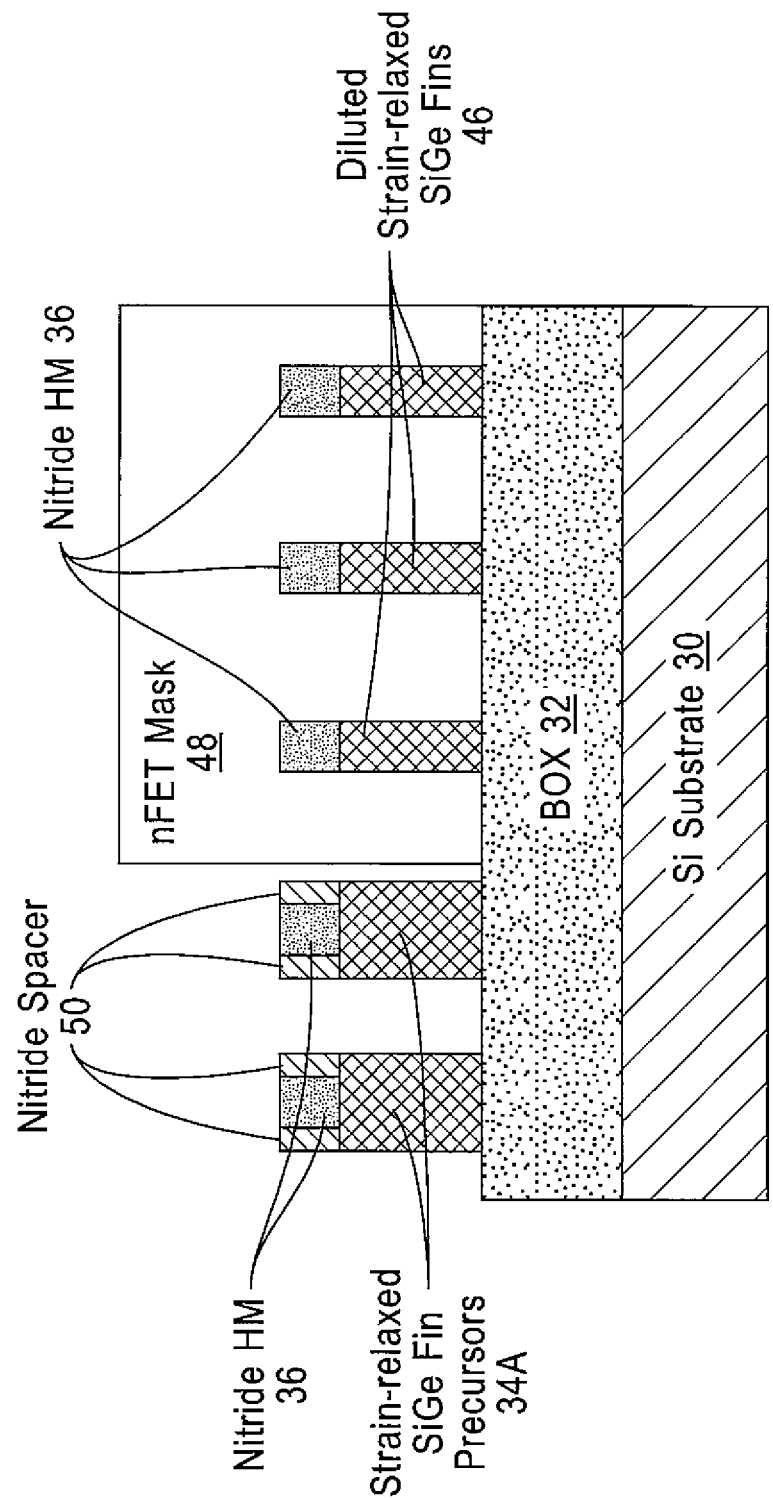

FIG. 15 shows the structure of FIG. 14 after performing an RIE procedure to remove those portions of the layer 34 of strain-relaxed $Si_{1-x}Ge_x$ not covered by the widened HMs (the HM 36 and surrounding nitride spacer 50). The end result of the RIE process is the formation of what may be referred to as strain-relaxed $Si_{1-x}Ge_x$ fin precursors 36A.

Figure 16:
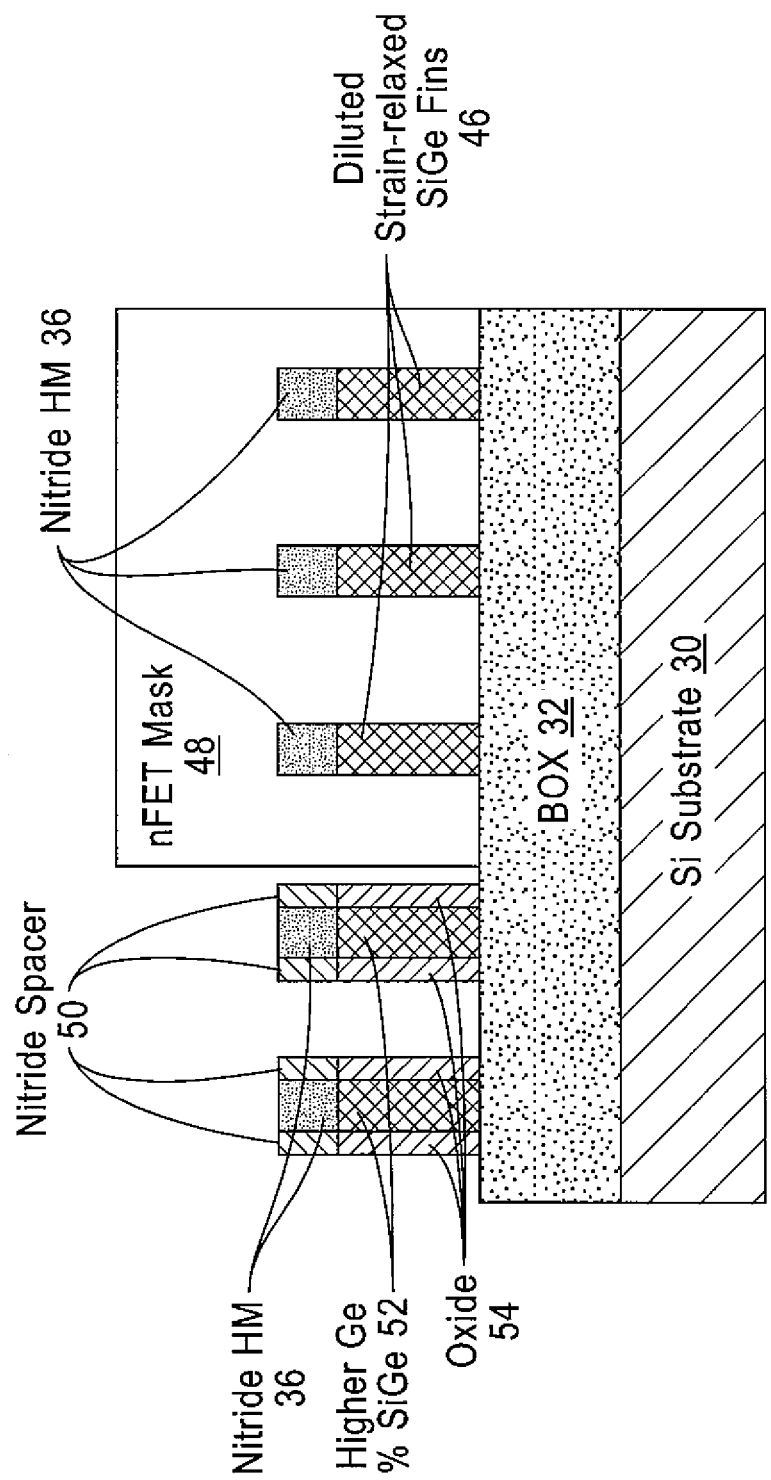

FIG. 16 shows the structure of FIG. 15 after performing a condensation process for the strain-relaxed $Si_{1-x}Ge_x$ fin precursors 36A. The condensation process involves performing an anneal operation. One suitable but not limiting range of temperature is about 700° C. to about 1000° C. for a period of some minutes. In a case where the anneal process involves oxidation, the oxygen reacts with silicon in the $Si_{1-x}Ge_x$ fin precursors 36A to form thermal silicon oxide 54. Meanwhile, Ge is repelled towards the core of the $Si_{1-x}Ge_x$ fin precursors 36A. As a result, the Ge concentration in a final SiGe fin is increased after oxidation. Such a Ge enrichment process can be referred to without limitation as "condensation". In the condensed (Ge enriched) $Si_{1-x}Ge_x$ fins, referred to in FIG. 16 as the higher Ge % SiGe 52, the value of x can be, for example, about 0.50, and the width (not considering the overlying oxide 54, is reduced by the oxidation process from a starting value of, for example, about 12 nm-14 nm to a final value of, for example, about 6 nm-7 nm.

In this exemplary method of the second embodiment the strain-relaxed layer 34 of SiGe can be a layer of $Si_{1-x}Ge_x$ where x has a non-zero value=n. In this method forming the first subset of fins related to pFET circuitry can comprise annealing the first subset of fins to form a set of condensed $Si_{1-x}Ge_x$ fins, where x has a value=m, where m>n. The step of annealing forms an oxide layer 54 that covers at least vertical surfaces of individual ones of the set of condensed $Si_{1-x}Ge_x$ fins. In this method n can be equal to about 0.25, and m can be equal to about 0.50. Individual ones of the first subset of fins related to pFET circuitry have a first width. In this embodiment the annealing consumes some of the $Si_{1-x}Ge_x$ of the fins to form the oxide, and individual ones of the fins of the first subset of fins have a second width that is less than the first width.

Figure 17:
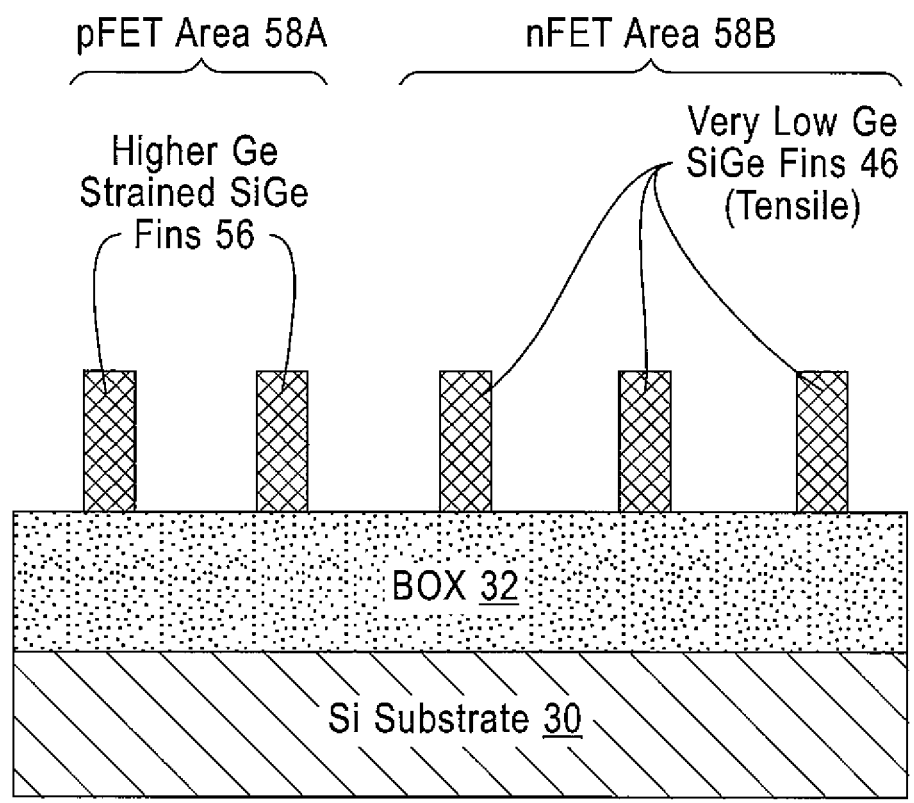

FIG. 17 shows the structure of FIG. 16 after removing the nFET mask 48, the HMs 36, the nitride spacers 50 and the thermal oxide 54, thereby leaving higher Ge percentage (e.g. x=0.50) SiGe fins 46 in a pFET area 58A and the Ge-depleted (e.g., almost pure Si) diluted fins 46 in an nFET area 58B. In this embodiment the s-SiGe fins 18 and the diluted SiGe fins 28 can have substantially equal fin widths that are established (and maintained during nFET processing) by the width of the HM 16 in conjunction with the spacers 50 and the condensation process. Processing can then continue in a conventional manner to form source/drains (S/Ds), gate structures, dielectric layer deposition(s) and vertical and horizontal metallization as needed for the final circuitry.

It is noted that any one of the structures shown in FIGS. 1-17 could be viewed as an intermediate structure formed during the overall process of forming a final structure. It is also noted that references to first and to second subsets of fins in this description and in the claims can refer to either of the pFET fins or the nFET fins, depending on the context of the reference.

It is to be understood that although the exemplary embodiments discussed above with reference to FIGS. 1-17 can be used on common variants of the FET device including, e.g., FET devices with multi-fingered FIN and/or gate structures and FET devices of varying gate width and length. Moreover, transistor devices can be connected to metalized pads or other devices by conventional ultra-large-scale integration (ULSI) metalization and lithographic techniques.

Integrated circuit dies can be fabricated with various devices such as a field-effect transistors, bipolar transistors, metal-oxide-semiconductor transistors, diodes, resistors, capacitors, inductors, etc. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. For example, the use of other similar or equivalent semiconductor fabrication processes, including deposition processes and etching processes may be used by those skilled in the art. Further, the exemplary embodiments are not intended to be limited to only those temperature ranges, semiconductor materials, Ge concentrations, dielectrics, layer thicknesses and the like that were specifically disclosed above. Any and all such and similar modifications of the teachings of this invention will still fall within the scope of this invention.

What is claimed is:

1. A structure comprising:
    a substrate;
    a first subset of fins defined in an nFET area of the structure, the first subset of fins being comprised of tensile strained substantially pure Si formed from an initial semiconductor layer disposed over the substrate, the initial semiconductor layer being comprised of a layer of $Si_{1-x}Ge_x$ having a first value of x; and
    a second subset of fins defined in a pFET area of the structure, the second subset of fins being comprised of compressive strained $Si_{1-x}Ge_x$ formed from the initial semiconductor layer and having a second value of x that is greater than the first value of x; where each fin of at least the first subset of fins is comprised of an overlying hard mask layer that preserves a location and shape of the first subset of fins during a process to reduce the value of x in the initial semiconductor layer.

2. The structure as in claim 1, where the process comprises iterated steps of depositing Si on the first subset of the set of fins, performing a Si—Ge intermixing process and removing a resultant Si—Ge intermix layer.

3. The structure as in claim 1, further comprising a dielectric layer disposed between each of the first and second subsets of fins and the substrate.

4. The structure as in claim 3, where the substrate is comprised of Si.

5. The structure as in claim 3, where the initial layer of semiconductor material is substantially lattice matched to the Si substrate.

6. A structure comprising:
a substrate;
a first subset of fins defined in an nFET area of the structure, the first subset of fins being comprised of tensile strained substantially pure Si formed from an initial semiconductor layer of Si—Ge disposed over the substrate; and
a second subset of fins defined in a pFET area of the structure, the second subset of fins being comprised of compressive strained Si—Ge formed from the initial semiconductor layer and having a greater percentage of Ge than a percentage of Ge in the first subset of fins; where each fin of at least the first subset of fins is comprised of an overlying hard mask layer that preserves a location and shape of the first subset of fins during a process to reduce the amount of Ge in the initial semiconductor layer of Si—Ge.

7. The structure as in claim 6, where the process comprises iterated steps of depositing Si on the first subset of the set of fins, performing a Si—Ge intermixing process and removing a resultant Si—Ge intermix layer.

8. The structure as in claim 6, further comprising a dielectric layer disposed between each of the first and second subsets of fins and the substrate.

9. The structure as in claim 8, where the substrate is comprised of Si.

10. The structure as in claim 8, where the initial layer of semiconductor material is substantially lattice matched to the Si substrate.

* * * * *